United States Patent
Gouko et al.

(10) Patent No.: US 10,718,612 B2
(45) Date of Patent: Jul. 21, 2020

(54) STRAIN DETECTOR

(71) Applicant: DENSO CORPORATION, Kariya, Aichi-pref. (JP)

(72) Inventors: Norio Gouko, Kariya (JP); Toshihisa Taniguchi, Kariya (JP); Atusi Sakaida, Kariya (JP); Keiji Okamoto, Kariya (JP); Yoshihiko Shiraishi, Kariya (JP); Masahiro Asano, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 254 days.

(21) Appl. No.: 15/822,345

(22) Filed: Nov. 27, 2017

(65) Prior Publication Data

US 2018/0149475 A1 May 31, 2018

(30) Foreign Application Priority Data

Nov. 30, 2016 (JP) ................................. 2016-232334

(51) Int. Cl.
*G01B 21/32* (2006.01)
*G01K 7/02* (2006.01)

(52) U.S. Cl.
CPC ............ *G01B 21/32* (2013.01); *G01K 7/023* (2013.01)

(58) Field of Classification Search
CPC ................................ G01B 21/32; G01K 7/023
See application file for complete search history.

(56) References Cited

U.S. PATENT DOCUMENTS

| 4,274,423 A | * | 6/1981 | Mizuno | ................ | A61B 5/0215 |
| | | | | | 600/488 |
| 4,591,996 A | * | 5/1986 | Vachon | .................... | G01L 1/24 |
| | | | | | 356/35.5 |
| 6,810,753 B2 | * | 11/2004 | Valdevit | ................... | G01B 7/18 |
| | | | | | 73/862.045 |

(Continued)

FOREIGN PATENT DOCUMENTS

| JP | 2006-284340 A | 10/2006 |
| JP | 2008-134182 A | 6/2008 |

(Continued)

OTHER PUBLICATIONS

English Machine Translation of JP2015014585A; Yazaki et al; pp. 1-33; Jan. 22, 2015; (Year: 2015).*

*Primary Examiner* — Lisa M Caputo
*Assistant Examiner* — Philip L Cotey

(57) ABSTRACT

A strain detector is interposed between a base and an attachment member in a structure body having the base, the attachment member, and the stainless bolts fixed the base to the attachment member. The strain detector includes an elastic member and a heat flux sensor. The elastic member is provided to compress or extend in accordance with a deformation of the stainless bolts, and the elastic member generates heat based on the compression and absorbs heat based on the extension. The heat flux sensor is deformed in accordance with the compression or the extension of the elastic member and the heat in the elastic member is transferred to the heat flux sensor. The heat flux sensor can detect a magnitude of the heat flux Fh1 as a heat stream between the inside of the elastic member and the outside, generated by the compression or the extension of the elastic member.

13 Claims, 9 Drawing Sheets

(56) References Cited

U.S. PATENT DOCUMENTS

| | | | |
|---|---|---|---|
| 8,710,611 B2* | 4/2014 | Cao | G01L 1/18 |
| | | | 257/444 |
| 2004/0124018 A1* | 7/2004 | Yanagi | B60N 2/002 |
| | | | 177/144 |
| 2008/0184818 A1* | 8/2008 | Lifvenborg | G01L 5/0004 |
| | | | 73/862.69 |
| 2011/0043787 A1* | 2/2011 | Duran | G01N 25/16 |
| | | | 356/33 |
| 2012/0187368 A1* | 7/2012 | Cao | B82Y 15/00 |
| | | | 257/13 |
| 2014/0286373 A1* | 9/2014 | Thresher | G01N 25/18 |
| | | | 374/29 |
| 2016/0109286 A1* | 4/2016 | Yazaki | G01H 1/00 |
| | | | 73/649 |

FOREIGN PATENT DOCUMENTS

| | | | | |
|---|---|---|---|---|
| JP | 2009-229183 A | | 10/2009 | |
| JP | 2015014585 A | * | 1/2015 | ............ G01H 1/00 |
| JP | 2016-080577 A | | 5/2016 | |

* cited by examiner

STRAIN DETECTOR

CROSS REFERENCE TO RELATED APPLICATION

The present application is based on Japanese Patent Application No. 2016-232334 filed on Nov. 30, 2016, disclosure of which is incorporated herein by reference.

TECHNICAL FIELD

The present disclosure relates to a strain detector for detecting the strain energy in a structure body provided with a plurality of fastened members fastened by a fastening member.

BACKGROUND

The strain detector for detecting a strain in the structure is well known. The strain detector as shown in JP-2009-229183 (referred to as document 1, hereinafter) includes a deformation quantity sensor for sensing a deformation quantity of a member in a measuring object, and a fastening member fastening the deformation quantity sensor to the member in the measuring object.

SUMMARY

In general, when the member is deformed by an external force, a deformation affects a function of an apparatus provided with the member. It is important to detect not only a deformation quantity of the member but also a speed of deformation in order to improve an accuracy, such as a machining accuracy in a machining apparatus and an assembling accuracy in a assembling apparatus, as one of functions of the apparatus. Since one of the plural members in the structure body is deformed by the external force, the energy referred to as strain energy is accumulated in the structure body. So, it is necessary to detect a deformation speed of the member in proportion with the strain energy. In the strain detector in the document 1, it is possible to detect the deformation quantity of the member, but it is may be difficult to detect a changing amount of the deformation quantity of the member.

It may be preferable to provide the strain detector detecting an amount of the strain energy in the structure body provided with a plurality of fastened members fastened by a fastening member.

In one exemplary aspect, according to a strain detector for detecting strain energy of a structure body having plurality of fastened members fastened by a fastening member, comprising:

a deformable member configured to be compressed or to be extended in accordance with a deformation of the fastening member or at least one of the plurality of the fastened members in such a manner that the deformable member generates heat when compressed and absorbs heat when extended; and a heat flux detecting member configured to be deformable based on the compression or the extension of the deformable member and provided to be in heat communication with the deformable member in such a manner that the heat flux detecting member detects a heat flux flowing between an inside of the deformable member and the outside.

DETAILED DESCRIPTION

Plural embodiments in the present disclosure are explained below with reference to the drawings.

First Embodiment

Figure 1:
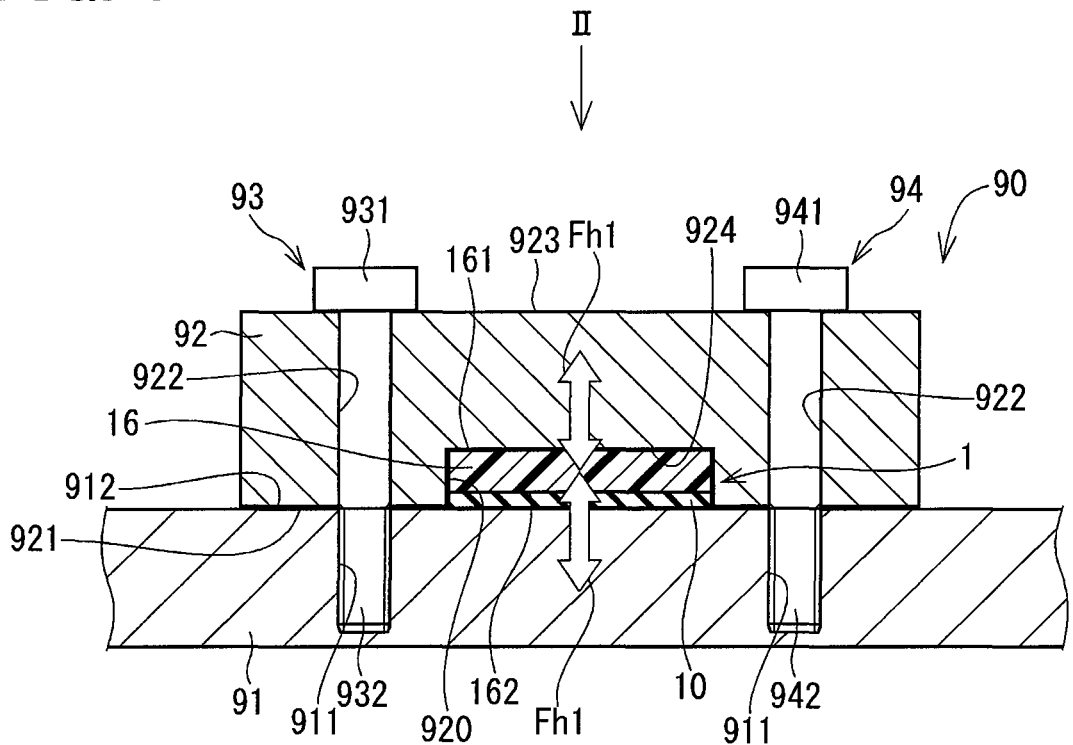
FIG. 1 is a diagram illustrating a schematic view of a strain detector in a first embodiment.
Figure 2:
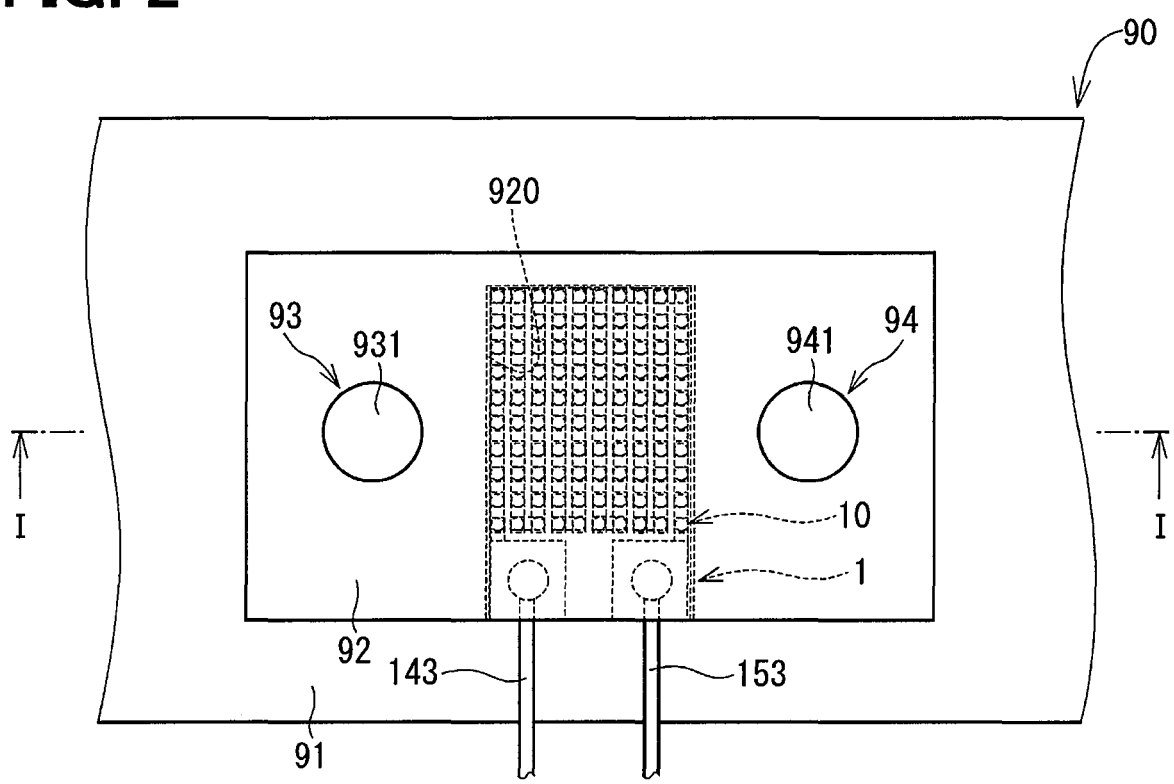
FIG. 2 is a diagram illustrating a plan view with respect to an arrow II in FIG. 1.

A strain detector in the first embodiment is explained based on FIGS. 1 to 4. As shown in FIG. 1, the strain detector 1 in the first embodiment is interposed between a base 91 referred to as "a fastened member" and an attachment member 92 referred to as "a fastened member", and the base 91 and the attachment member 92 are fixed by the stainless bolts 93, 94 referred to as "a fastening member".

Firstly, a structure body 90 provided with the strain detector 1 is explained. The structure body 90 includes the base 91, the attachment member 92, and the stainless bolts 93, 94.

The base 91 is made of a metal, such as SUS 303. The base 91 is fixed to, for example, a table or a floor (not shown). FIG. 1 shows a part of the base 91 on which the attachment member 92 is attached. The base 91 has bolt holes 911 on a side of the attachment member 92 with respect to the base 91, and on a contact surface 912 of the base 91. The bolt holes 911 are formed to be inserted by the stainless bolts 93, 94 and have a threading formed inside of the bolt holes 911.

The attachment member 92 is made of a metal, such as SUS 303. A contact surface 921 on a side of the base 91 of the attachment member 92 is able to abut on the contact surface 912 of the base 91. The attachment member 92 has through holes 922 in which the stainless bolts 93, 94 are inserted. The through holes 922 are formed from the contact surface 921 to an opposite surface 923 with respect to the contact surface 921 such that the stainless bolts 93, 94 are inserted into the through holes 922.

The stainless bolts 93, 94 have respectively bolt heads 931, 941 and bolt shafts 932, 942. The bolt heads 931, 941 are formed to abut on the end surface 923 of the attachment member 92. The bolt shafts 932, 942 are formed to be inserted Into the through holes 922. Outer surfaces of the bolt shafts 932, 942 on an opposite side of the bolt heads 931, 941 have a threading engaged with a threading formed inside of the bolt holes 911.

After the attachment member 92 is set on the contact surface 912 of the base 91 in such a manner that the though holes 922 and the bolt holes 911 are communicated with each other, the stainless bolts 93, 94 are inserted into the through holes 922, and then the stainless bolts 93, 94 are inserted into the bolt holes 911. The threading of the stainless bolts 93, 94 inserted into the bolt holes 911 are engaged with the threading formed inside of the bolt holes 911. After that, the bolt heads 931, 941 of the stainless bolts 93, 94 abut on the end surface 923 of the attachment member 92 by rotating the stainless bolts 93, 94, and the base 91 and the attachment member 92 are fastened.

The strain detector 1 is provided in a groove 920 of the attachment member 92. The strain detector 1 has an elastic member 16 referred to as "a deformable member", and a heat flux sensor 10 referred to as "a heat flux detecting member".

The elastic member 16 is formed as a substantially planar shape, and made of for example, viton rubber. The elastic member 16 generates heat based on compressing, and absorbs heat based on extending. One surface 161 of the elastic member 16 comes into close contact with a bottom wall 924 of the groove 920 by an adhesive (not shown).

The heat flux sensor 10 is provided on an end surface 162 in the groove 920 and is interposed between the elastic member 16 and the base 91. The heat flux sensor 10 is made from a flexible member and is deformable based on compressing or extending of the elastic member 16. The heat flux, which is a heat flow from an inside of the elastic member 16 to an outside of the elastic member 16, passes the heat flux sensor 10. The heat flux sensor 10 detects the heat flux crossing the heat flux sensor itself. The heat flux sensor 10 outputs voltage (for example) in accordance with the detected heat flux.

Figure 3:
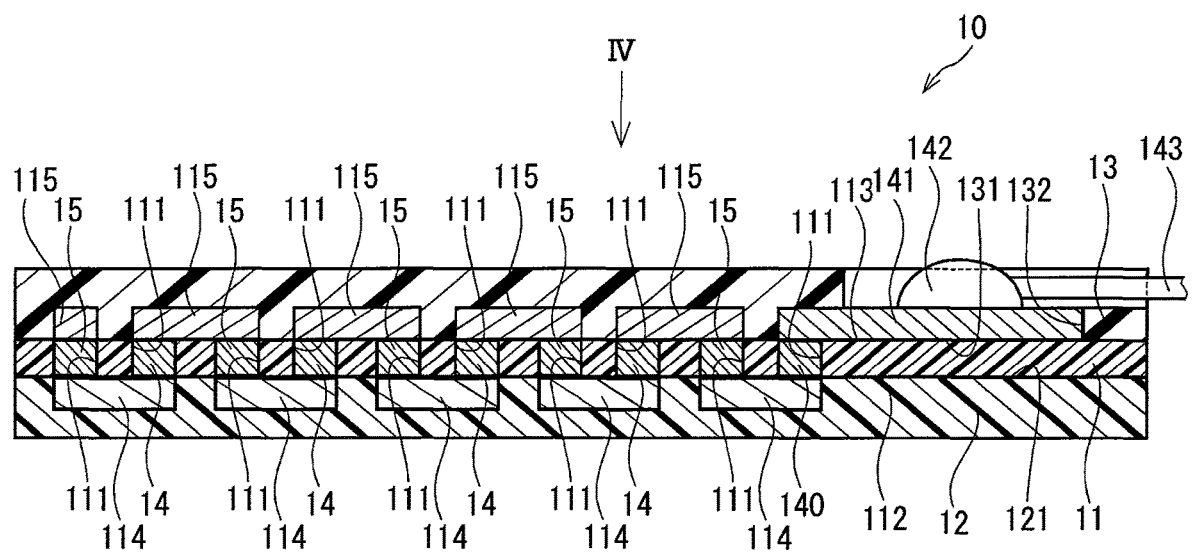
FIG. 3 is a diagram illustrating a side view of a heat flux sensor in the strain detector in the first embodiment.

As shown in FIG. 3, the heat flux sensor 10 includes an insulation substrate 11, a rear surface protecting member 12, a front surface protecting member 13, a first interlayer connecting member 14, and a second interlayer connecting member 15. FIG. 3 shows an enlarged view of the construction of the heat flux sensor 10 in a direction from the rear surface protecting member 12 to the front surface protecting member 13 in comparison with an actual construction.

The insulation substrate 11 is made of a film from a thermoplastic resin. The insulation substrate 11 has a plurality of via holes 111, penetrating in a thickness direction of the insulation substrate 11. In the via holes 111, the first interlayer connecting member 14 or the second interlayer connecting member 15 is provided. The via hole 111 provided with the first interlayer connecting member 14 is positioned next to the via hole 111 provided with the second interlayer connecting member 15. In the insulation substrate 11, the first interlayer connecting member 14 and the second interlayer connecting member 15 are alternately displaced and are separated from each other with a predetermined gap.

The rear surface protecting member 12 is formed as a film from a thermoplastic resin, and is a substantially same size with respect to the insulation substrate 11. The rear surface protecting member 12 is provided on a rear surface 112 of the insulation substrate 11. A rear surface pattern 114 referred to as "a first conductive pattern" is formed between the rear surface 112 of the insulation substrate 11 and a surface 121 of the rear surface protecting member 12 on a side of the insulation substrate 11. The rear surface pattern 114 is pattered by a cupper foil or the like. The rear surface pattern 114 is electrically connected between the first interlayer connecting member 14 and the second interlayer connecting member 15.

The front surface protecting member 13 is formed as a film from a thermoplastic resin, and is a substantially same size with respect to the insulation substrate 11. The front surface protecting member 13 is provided on a front surface 113 of the insulation substrate 11. A front surface pattern 115 referred to as "a second conductive pattern" is formed between the front surface 113 of the insulation substrate 11 and a surface 131 of the front surface protecting member 13 on a side of the insulation substrate 11. The front surface pattern 115 is pattered by a cupper foil or the like, and referred to as a plurality of second conductive patterns. A front surface pattern 115 is electrically connected between the first interlayer connecting member 14 and the second interlayer connecting member 15.

The plural first interlayer connecting members 14 and the plural second interlayer connecting members 15 are made of different metal each other so as to exhibit a seebeck effect. For example, the first interlayer connecting members 14 are made of a metallic compound which is sintered as a solid phase, in such a manner that a powder of Bi—Sb—Te alloy constructed as p-type maintains a crystal structure of plural metal atoms before a sintering step. The second interlayer connecting members 15 are made of a metallic compound which is sintered as a solid phase, in such a manner that a powder of Bi—Te alloy constructed as n-type maintains a crystal structure of plural metal atoms before a sintering step. The first interlayer connecting members 14 and the second interlayer connecting members 15 are alternately connected in series by means of the rear surface pattern 114 and the front surface pattern 115.

Figure 4:
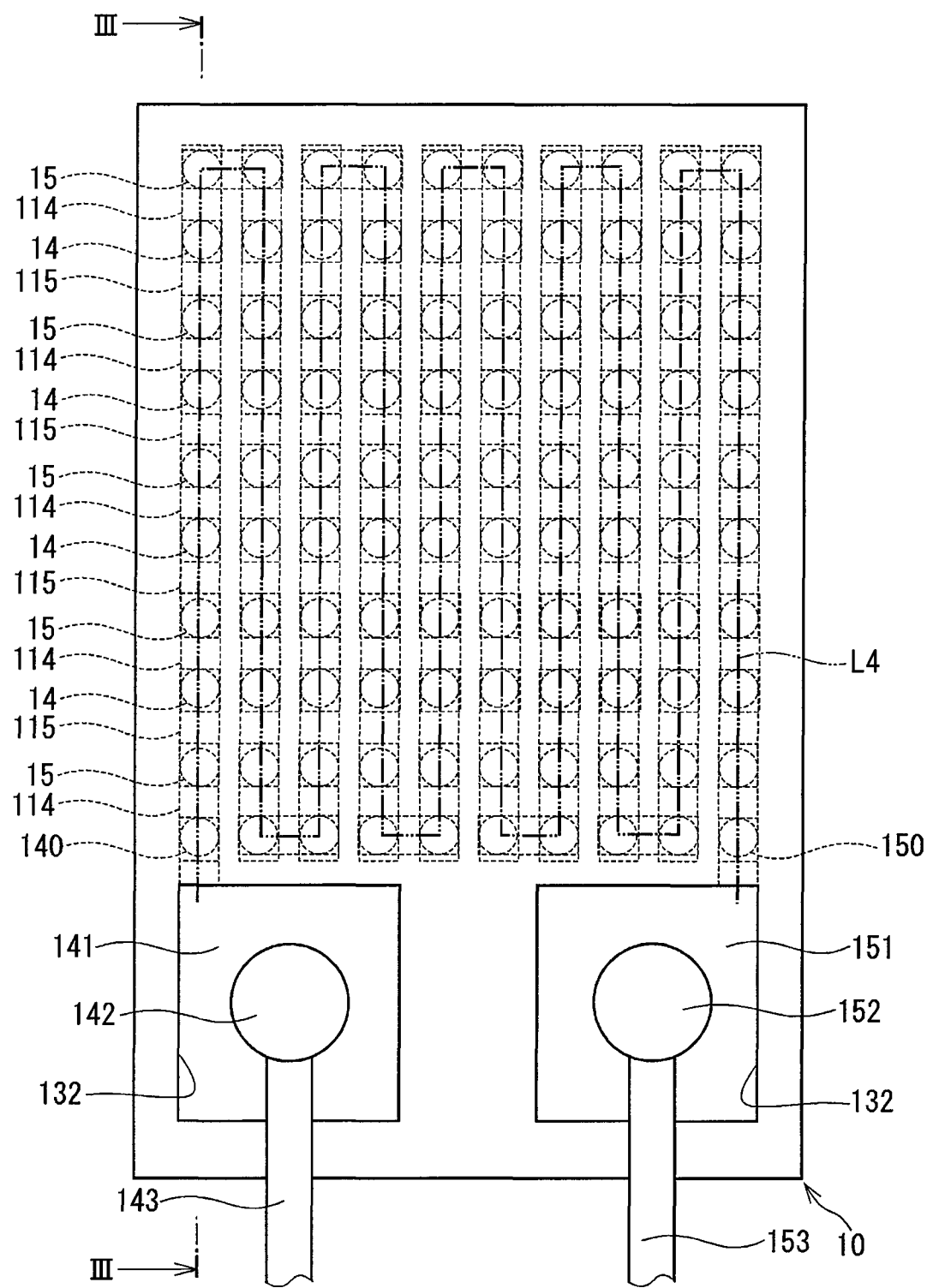
FIG. 4 is a diagram illustrating a plan view with respect to an arrow IV in FIG. 3.

As shown in FIGS. 3 and 4, one first interlayer connecting member 140 of the plural first interlayer connecting members 14 is electrically connected to a terminal 141. One second interlayer connecting member 150 of the plural second interlayer connecting members 15 is electrically connected to a terminal 151. As shown in FIG. 4, the rear surface pattern 114, the first interlayer connecting members 14, the front surface pattern 115, and the second interlayer connecting members 15 are connected meanderingly such that the terminals 141 and 151 are respectively positioned at both ends of the above connection (see a two-dot-one-dash line L4 in FIG. 4). The terminals 141, 151 expose to the outside through an opening 132 of the front surface protecting member 13.

The terminal 141 is electrically connected to an output line 143 through a connecting bump 142. The terminal 151 is electrically connected to an output line 153 though a connecting bump 152.

In the heat flux sensor 10, when the heat amount flowing in a thickness direction (a direction from the rear surface protecting member 12 to the front surface protecting member 13 in FIG. 3) of the heat flux sensor 10 changes, an induced voltage induced in the first interlayer connecting members 14 and the second interlayer connecting members 15, which are alternately connected in series, changes. The heat flux sensor 10 outputs the voltage as a detection signal to the outside through the output lines 143, 153. Based on the detection signal, the magnitude of the heat flux passing the heat flux sensor 10 is calculated.

In the first embodiment, a depth of the groove 920 in the attachment member 92 is 1 mm (millimeter), and a thickness of the elastic member 16 is 1 mm (millimeter), and a thickness of the heat flux sensor 10 is 0.3 mm (millimeter). When the strain detector 1 is attached in the groove 920, the elastic member 16 is interposed between the base 91 and the attachment member 92 in a compressed state. The elastic member 16 is compressed at the compression deformation rate of substantially 30%, when no external force is applied to the structure body 90.

The function of the strain detector 1 in the first embodiment is explained in accordance with FIG. 1.

When the external force equal to or larger than a predetermined value is applied to the structure body 90, a strain is generated in the structure body 90. The strain in the structure body 90 means that at least one of the base 91, the attachment member 92, and the stainless bolts 93, 94, constructed as the structure body 90 is deformed by the external force. At this time, the strain energy due to the deformation is accumulated in the structure body 90.

When at least one of the base 91, the attachment member 92, and the stainless bolts 93, 94 is deformed by the external force, a distance between the base 91 and the attachment member 92 in the groove 920, and in detail a distance between the contact surface 912 and the bottom wall 924 is changed. So, the elastic member 16 is compressed or extended. Due to the external force applied to the structure body 90, the distance between the base 91 and the attachment member 92 is shortened, and the elastic member 16 is compressed such that heat is generated inside of the elastic member 16. When the heat is generated in the elastic member 16, the heat flux Fh1 flowing from the inside of the elastic member 16 to the outside is generated as shown in FIG. 1. The heat flux sensor 10 detects the magnitude of the heat flux Fh1.

When the distance between the base 91 and the attachment member 92 in the groove 920 becomes longer and the elastic member 16 is extended, the elastic member 16 absorbs heat. So, the heat flux Fh1 flowing from the outside to the inside of the elastic member 16 is generated. The heat flux sensor 10 detects the magnitude of the heat flux Fh1.

Since a warp or an undulation exists on the contact surface 912 of the base 91 and on the contact surface 921 of the attachment member 92, a gap between the base 91 and the attachment member 92 is formed. When the base 91 and the attachment member 92 are assembled, the attachment member 92 is deformed in accordance with a tightening condition of the stainless bolts 93, 94. When the attachment member 92 is deformed, the heat flux Fh1 between the inside of the elastic member 16 and the outside is generated. The heat flux sensor 10 detects the magnitude of the heat flux Fh1.

(a) In the stain detector 1 according to the first embodiment, when the external force is applied to the structure body 90 and the strain is generated in the structure body 90, the elastic member 16 is compressed or extended. So, the elastic member 16 generates heat, or absorbs heat. When the elastic member 16 generates heat or absorbs heat, the heat flux Fh1 flowing between the elastic member 16 and a member around the elastic member 16 is generated. The magnitude of the heat flux Fh1 is detected by the heat flux sensor 10 which is deformable in accordance with the compressing or extending of the elastic member 16.

The heat flux sensor 10 outputs a voltage having a magnitude corresponding to the magnitude of the heat flux Fh1 in proportional to the deformed amount of the elastic member 16. The heat flux sensor 10 is able to output each voltage in accordance with the heat flux every unit time. Based on a time variation of the voltage outputted from the heat flux sensor 10, amount of change of the strain energy, which is proportion to a product of the deformed amount of the elastic member 16 and a deformation velocity of the elastic member 16, can be detected.

Accordingly, the strain detector 1 according to the first embodiment can detect the amount of change of the strain energy in the structure body 90, because the magnitude of the heat flux Fh1 is detected every unit time by means of the deformable heat flux sensor 10 in accordance with the compressing or extending of the elastic member 16.

(b) The heat flux sensor 10 is provided with the insulation substrate 11. The insulation substrate 11 is formed as a film, made of the thermoplastic resin. The heat flux sensor 10 is flexible, and is formed to be deformable in accordance with the compressing or extending of the elastic member 16. The heat flux sensor 10 can detect the heat flux Fh1 flowing between the elastic member 16 and a member around the elastic member 16 with high accuracy. Accordingly, the strain detector 1 according to the first embodiment detects the amount of change of the strain energy in the structure body 90 with high accuracy.

(c) In the strain detector 1 according to the first embodiment, the elastic member 16 interposed between the base 91 and the attachment member 92 is compressed at the compression deformation rate of substantially 30%. So, the elastic member 16 can be deformed by the deformation of the base 91 or the attachment member 92. Accordingly, based on the deformation of the base 91 or the attachment member 92, the elastic member 16 is easily compressed or extended, such that the strain detector 1 according to the first embodiment detects the amount of change of the strain energy in the structure body 90 with high accuracy.

(d) The strain detector 1 according to the first embodiment is provided in the groove 920 on the attachment member 92, and is provided between the base 91 and the attachment member 92. Since the base 91 contacts the attachment member 92 and the strain detector 1 can be interposed between the base 91 and the attachment member 92, an assembling state of the base 91 and the attachment member 92 can be stable.

Second Embodiment

Figure 5:
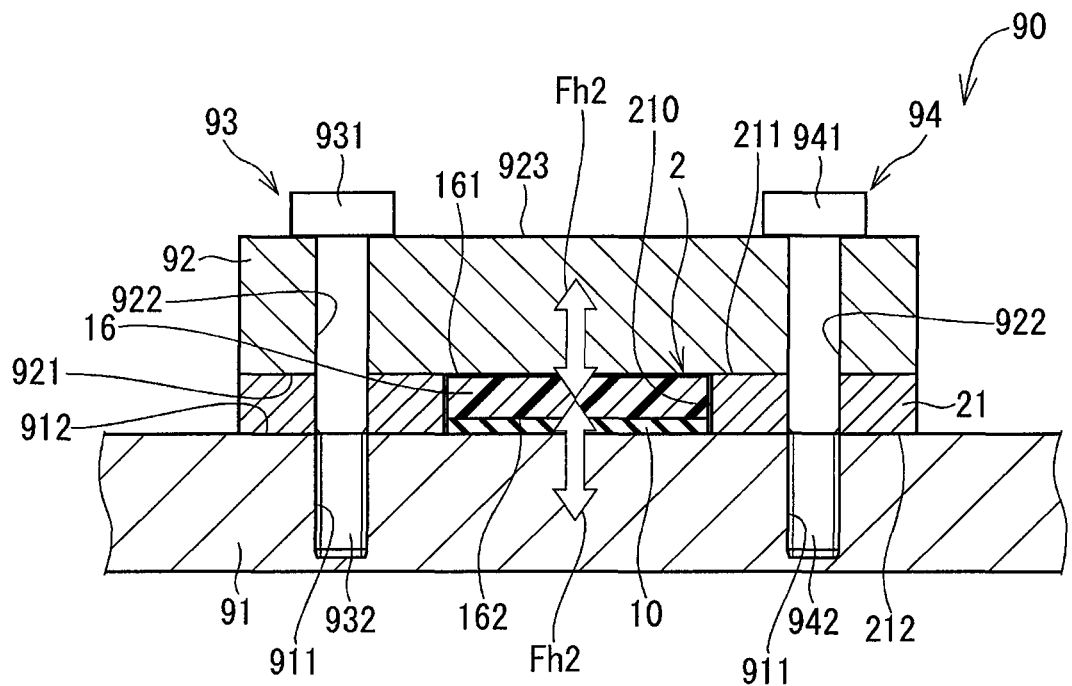
FIG. 5 is a diagram illustrating a schematic view of a strain detector in a second embodiment.

Next, a strain detector in a second embodiment is explained with reference to FIG. 5. In the second embodiment, a spacer is further provided between the base and the attachment member in comparison with the first embodiment. In the description which follows and in the drawings, identical or similar components bear the same reference numerals or characters in the second embodiment.

The strain detector 2 in the second embodiment has the elastic member 16, a spacer 21, and the heat flux sensor 10.

The spacer 21 is interposed between the contact surface 912 of the base 91 and the contact surface 921 of the attachment member 92. The spacer 21 is a substantially same size of the attachment member 92.

One end surface 211 of the spacer 21 is in contact with the contact surface 921. The spacer 21 has a housing space 210 at a substantially center position of the spacer 21, in which the elastic member 16 and the heat flux sensor 10 are housed. Similarly to the first embodiment, the elastic member 16 is housed in the housing space 210 in the compressed state, and is compressed at the compression deformation rate of substantially 30%, when no external force is applied to the structure body 90.

(e) In the second embodiment, the elastic member 16 and the heat flux sensor 10 are housed in the housing space 210 of the spacer 21, which is in contact with both the base 91 and the attachment member 92. The heat flux sensor 10 housed in the housing space 210 detects the magnitude of the heat flux Fh2 flowing between the elastic member 16 and a member around the elastic member 16 every unit time. So, the strain detector 2 according to the second embodiment obtains the effects (a) to (c) in the first embodiment, and an assembling state of the base 91 and the attachment member 92 can be stable, even if the strain detector 2 is interposed between the base 91 and the attachment member 92.

Third Embodiment

Figure 6:
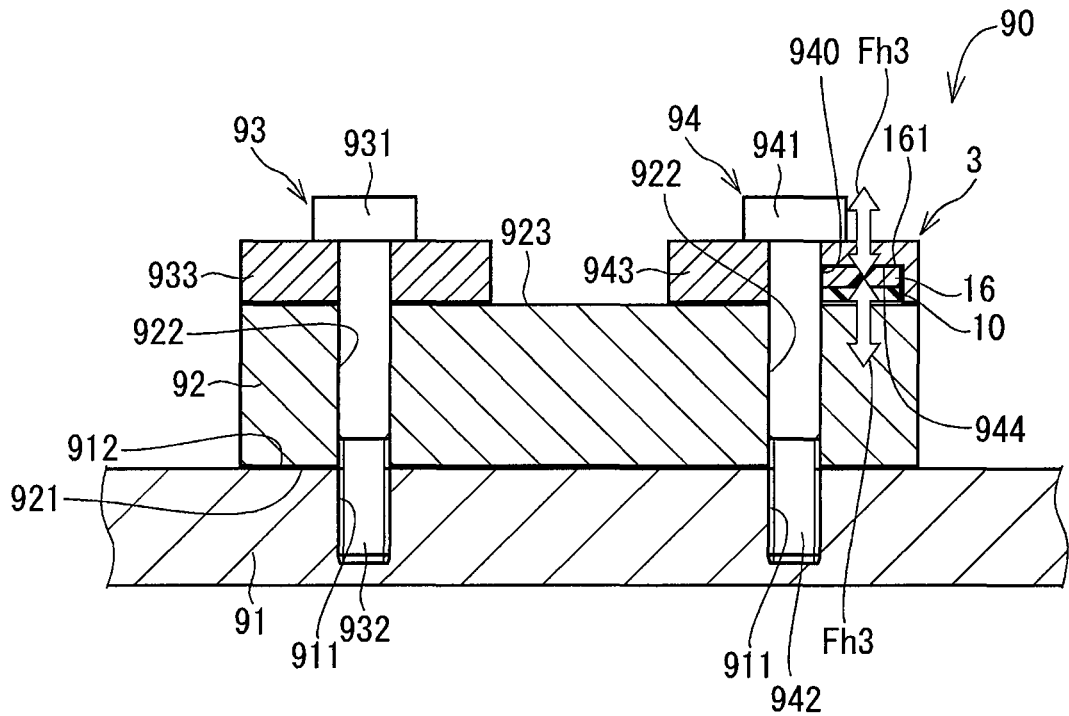
FIG. 6 is a diagram illustrating a schematic view of a strain detector in a third embodiment.

Next, a strain detector in a third embodiment is explained with reference to FIG. 6. In the third embodiment, a washer is further provided in comparison with the first embodiment. In the description which follows and in the drawings, identical or similar components bear the same reference numerals or characters in the second embodiment.

The strain detector 3 in the third embodiment has the elastic member 16, washers 933, 943, and the heat flux sensor 10.

The washers 933, 943 are interposed between the bolt heads 931, 941 of the stainless bolts 93, 94 and the attachment member 92. The washers 933, 943 prevent damage to the end surface 923 of the attachment member 92 due to the tightening of the stainless bolts 93, 94.

The washer 943 has a groove 940 on a side of the attachment member 92 referred to as "a housing space". The elastic member 16 and the heat flux sensor 10 are housed in the groove 940. The elastic member 16 has one end surface which adheres to a bottom wall 944 of the groove 940 by an adhesive material. As with the first embodiment, the elastic member 16 housed in the groove 940 is compressed at the compression deformation rate of substantially 30%, when no external force is applied to the structure body 90.

(f) In the third embodiment, the elastic member 16 and the heat flux sensor 10 are housed in the groove 940. The washer 943, which is in contact with the bolt head of the stainless bolt and the attachment member 92, is provided in the groove 940. The heat flux sensor 10 housed in the groove 940 detects the magnitude of the heat flux Fh3 flowing between the elastic member 16 and a member around the elastic member 16 every unit time. In the strain detector 3 in the third embodiment, an assembling state of the base 91 and the attachment member 92 can be stable, and the amount of change of the strain energy in the structure body 90 due to the deformation of the stainless bolt 94 can be detected.

(g) In the strain detector 3 according to the third embodiment, the elastic member 16 is compressed at the compression deformation rate of substantially 30%, and the heat flux sensor 10 is flexible. Accordingly, in the strain detector 3 according to the third embodiment, the amount of change of the strain energy in the structure body 90 due to the deformation of the stainless bolt 94 can be detected with high accuracy.

Fourth Embodiment

Figure 7:
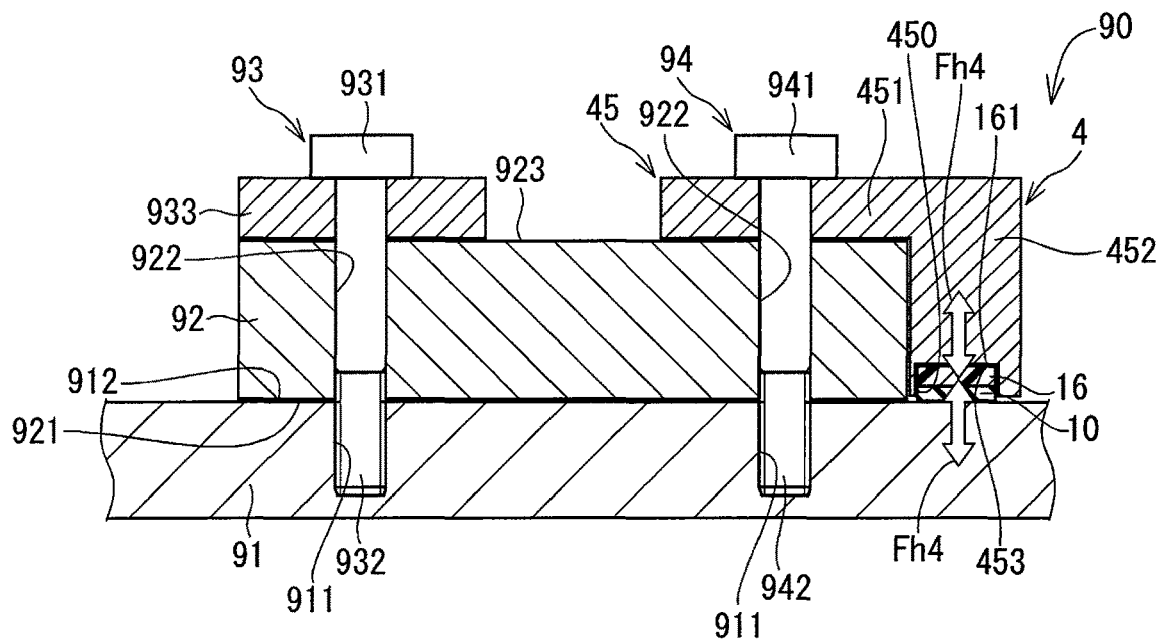
FIG. 7 is a diagram illustrating a schematic view of a strain detector in a fourth embodiment.

Next, a strain detector in a fourth embodiment is explained with reference to FIG. 7. In the fourth embodiment, a configuration of a washer is different from the washer described in the third embodiment. In the description which follows and in the drawings, identical or similar components bear the same reference numerals or characters in the third embodiment.

The strain detector 4 in the fourth embodiment has the elastic member 16, the washers 933, 45, and the heat flux sensor 10.

The washer 45 has a main portion 451 and the extension portion 452.

The main portion 451 of the washer 45 is interposed between the bolt head 941 and the attachment member 92. The main portion 451 prevents damage to the end surface 923 of the attachment member 92 due to the tightening of the stainless bolts 94.

The extension portion 452 is formed to extend toward the base 91 along a side wall 925 of the attachment member 92 from an outer peripheral part of the main portion 451. On the end portion of an opposite side with respect to a part of the extension portion 452 connected to the main portion 451, a groove 450 in which the elastic member 16 and the heat flux sensor 10 can be housed is formed as a housing space.

The elastic member 16 has one end surface 161 which adheres to a bottom wall 453 of the groove 450 by an adhesive material. The bottom wall is referred to as "an end surface in an extension portion side".

The elastic member 16 housed in the groove 450 is compressed at the compression deformation rate of substantially 30%, when no external force is applied to the structure body 90.

The heat flux sensor 10 is provided on a side of the base 91 of the elastic member 16, and the heat flux sensor 10 contacts the contact surface 912 referred to as "an end surface in an elastic member side".

In the fourth embodiment, the elastic member 16 and the heat flux sensor 10 are housed in the groove 450 formed on the extension portion 452 of the washer 45. The heat flux sensor 10 housed in the groove 450 detects the magnitude of the heat flux Fh4 flowing between the elastic member 16 and a member around the elastic member 16 every unit time. The strain detector 4 in the fourth embodiment obtains the effects (f) and (g) in the third embodiment.

In the fourth embodiment, the heat flux sensor 10 adhered to the elastic member 16 is in contact with the base 91 and is disposed in a position separated comparably from the bolt head 941. Since the degree of the deformation of the stainless bolt 94 with respect to the base can be enlarged in the elastic member 16 and the heat flux sensor 10, the amount of change of the strain energy in the structure body 90 due to the deformation of the stainless bolt 94 can be detected with high accuracy.

Fifth Embodiment

Figure 8:
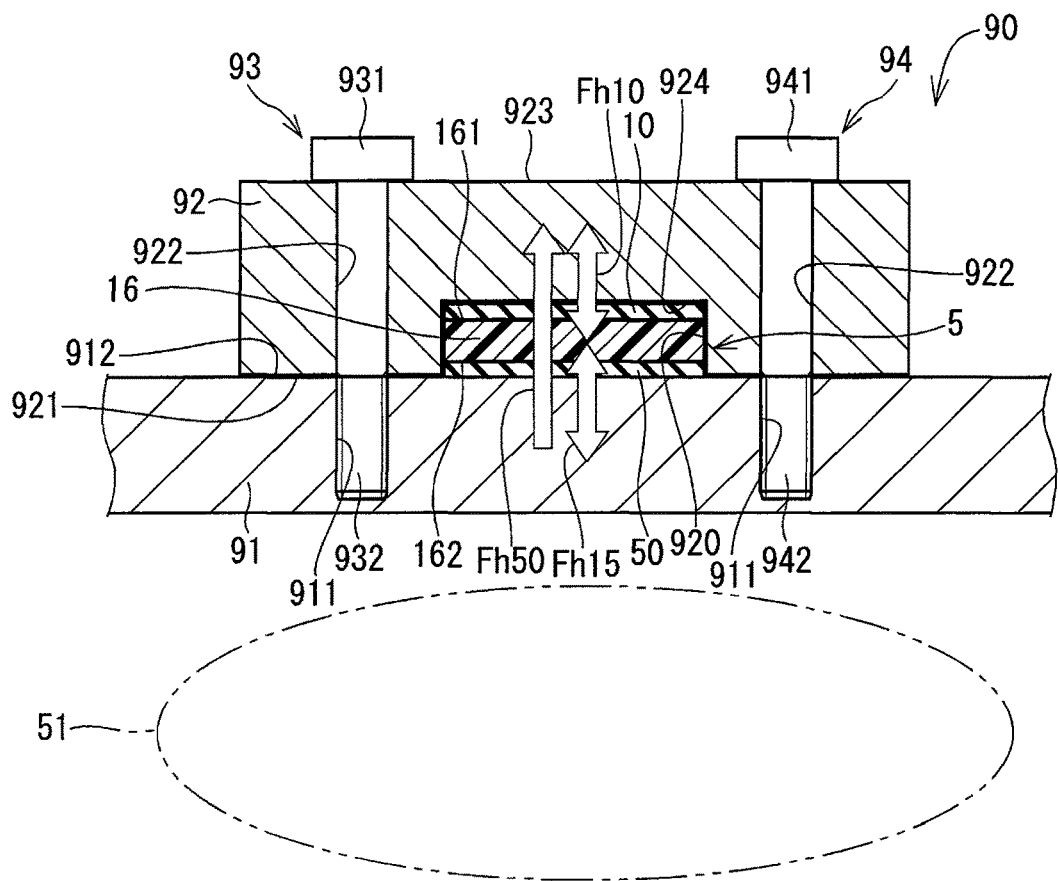
FIG. 8 is a diagram illustrating a schematic view of a strain detector in a fifth embodiment.

Next, a strain detector in a fifth embodiment is explained with reference to FIG. 8. In the fifth embodiment, two heat flux sensors are provided, and such configuration is different from the first embodiment. In the description which follows and in the drawings, identical or similar components bear the same reference numerals or characters in the first embodiment.

The strain detector 5 in the fifth embodiment has the elastic member 16, and two heat flux sensors 10 and 50. The strain detector 5 is provided in the structure body 90, in which a heating source generating a relatively high heat is disposed on an opposite side of the base 91 with respect to the attachment member 92. The heating source is not limited to a heater, a pump, and a motor and so on.

The elastic member 16 is Interposed between two heat flux sensors 10 and 50 in the groove 920.

The heat flux sensor 10 is provided on one end surface 161 of the elastic member 16, and is formed to be deformable in accordance with the compressing or extending of the elastic member 16. The heat flux sensor 10 adheres to a bottom wall 924 of the groove 920 by an adhesive material (not shown). The heat flux sensor 10 can detect a heat flux Fh10 flowing between the region of the attachment member 92 which is positioned on an opposite side of the base 91 with respect to the elastic member 16, and the elastic member 16.

The heat flux sensor 50 has a substantially same structure as the heat flux sensor 10. The heat flux sensor 50 is provided on another end surface 162 of the elastic member 16 on a side of the base 91, and is formed to be deformable in accordance with the compressing or extending of the elastic member 16. The heat flux sensor 50 adheres to the contact surface 912 of the base 91. The heat flux sensor 50 can detect a heat flux Fh15 flowing between the base 91 and the elastic member 16.

Heat generated in the heating source 51 flows in the structure body 90. A heat flux due to the heat generated in the heating source 51 is referred to as heat flux Fh50.

A detection signal S10 outputted from the heat flux sensor 10 is a magnitude of total heat flux summing up the heat flux Fh10 and the heat flux Fh50. A detection signal S50 outputted from the heat flux sensor 50 is a magnitude of total heat flux summing up the heat flux Fh15 and the heat flux Fh50. A method to calculate the heat flux Fh10 or Fh15 in the elastic member 16 from two detection signals S10 and S50 is explained below. In the following explanation, a direction from the heating source 51 to the attachment member 92 in FIG. 7 is defined as plus, and the calculation method regarding a state, in which the elastic member 16 generates heat, is explained. The calculation method regarding a state, in which the elastic member 16 absorbs heat, is a same manner.

The detection signal S10 is represented by the following formula (1).

$$S10 = Fh50 + Fh10 \quad (1)$$

The detection signal S50 is represented by the following formula (2).

$$S50 = Fh50 - Fh10 \quad (2)$$

A right side and a left side in the above formulas (1) and (2) are respectively added such that the formula (3) is shown as follows.

$$S10 + S50 = 2 \times Fh50 + Fh10 - Fh15 \quad (3)$$

Here, the heat flux Fh10 and the heat flux Fh15 are the same absolute value, because of the heat flux of the elastic member 16. So, the following formula (4) is achieved.

$$Fh50 = (S10 + S50)/2 \quad (4)$$

The heat flux Fh10 or the heat flux Fh15 is calculated by using the formula (1) or (2) and the formula (4) as follows.

$$Fh10 = S10 - (S10 + S50)/2 \quad (5)$$

In the above mentioned, the heat flux Fh10 or the heat flux Fh15 is calculated.

(h) In the fifth embodiment, the strain detector 5 has two heat flux sensors 10, 50 which interpose the elastic member 16. When the heating source 51 is positioned near the structural body 90 as a detection target of the strain energy, the magnitude of the heat flux in the elastic member 16 is detected every unit time by using the formula (5) based on the detection signals S10, S50 of two heat flux sensors 10, 50. The strain detector 5 in the fifth embodiment obtains the effects (a) to (d) in the first embodiment and the amount of change of the strain energy in the structure body 90 can be detected with high accuracy without any influence of the heat of the external heating source 51 which is a disturbance in the detection of the heat flux.

Sixth Embodiment

Figure 9:
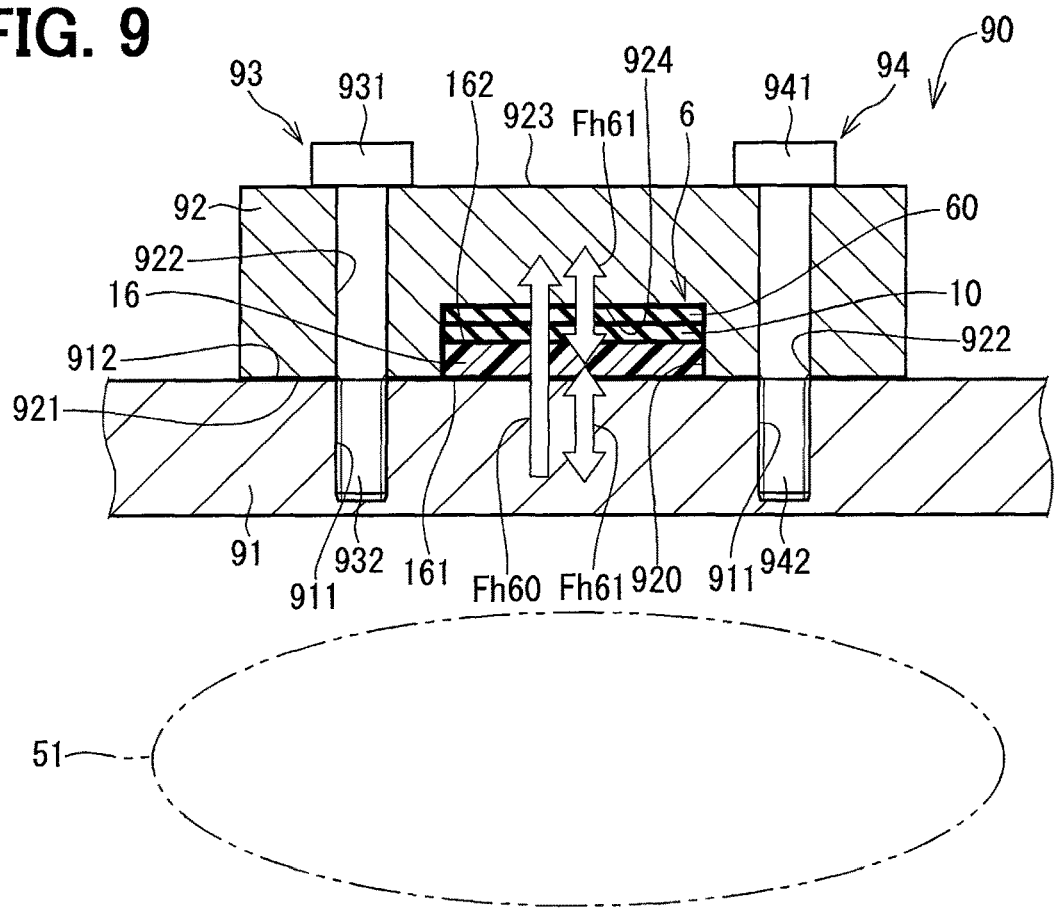
FIG. 9 is a diagram illustrating a schematic view of a strain detector in a sixth embodiment.

Next, a strain detector in a sixth embodiment is explained with reference to FIG. 9. In the sixth embodiment, two heat flux sensors are provided on one side of the elastic member, and such configuration is different from in the first embodiment. In the description which follows and in the drawings, identical or similar components bear the same reference numerals or characters in the first embodiment.

The strain detector 6 in the sixth embodiment has the elastic member 16, and two heat flux sensors 10, 60. The strain detector 6 is provided in the structure body 90, in which a heating source generating a relatively high heat is disposed on an opposite side of the base 91 with respect to the attachment member 92.

The elastic member 16 and two heat flux sensors 10, 50 are provided in the groove 920. In the groove 920, the elastic member 16, the heat flux sensor 10 and the heat flux sensor 60 are successively assembled from a side of the base 91.

The one surface 161 of the elastic member 16 contacts the contact surface 912 of the base 91. The elastic member 16 is compressed at the compression deformation rate of substantially 30%, when no external force is applied to the structure body 90. When the elastic member 16 is compressed or extended, the heat flux Fh61 flows between the elastic member 16 and the member around the elastic member 16.

The heat flux sensor 10 is provided on another end surface 162 of the elastic member 16 on the opposite side of the end surface 161 contacting the contact surface 912 of the base 91. The heat flux sensor 10 can detect a magnitude of a heat flux Fh61 flowing between the region of the attachment member 92 which is positioned on an opposite side of the base 91 with respect to the elastic member 16, and the elastic member 16, every unit time.

The heat flux sensor 60 has a substantially same structure as the heat flux sensor 10 and contacts the opposite end surface of the elastic member 16, to which the heat flux sensor 10 is adhered. The heat flux sensor 60 adheres to a bottom wall 924 of the groove 920 by an adhesive material (not shown). The heat flux sensor 60 can detect a heat flux Fh61 flowing between the region of the attachment member 92, which is positioned in an opposite side of the base 91 with respect to the elastic member 16, and the elastic member 16.

In the sixth embodiment, the heat generated by the heating source 51 transfers to the structure body 90. A heat flux based on the heat generated in the heating source 51 is referred to as a heat flux Fh60.

A function of the strain detector 6 in the sixth embodiment is explained. A difference between the voltage outputted from the heat flux sensor 10 and the voltage outputted from the heat flux sensor 60 is referred to as a performance output. The performance output can be detected based on the voltages outputted from two heat flux sensors 10, 60. The heat flux sensor 10 and the heat flux sensor 60 are provided in a same direction in such a manner that one terminal of the heat flux sensor 10 is connected to one terminal of the heat flux sensor 60 which has a same electrode with respect to the one terminal of the heat flux sensor 10. The performance output can be detected based on the voltage between the other terminal of the heat flux sensor 10 and the other terminal of the heat flux sensor 60 which has a same electrode with respect to the other terminal of the heat flux sensor 10.

When a strain in the structure body 90 is not generated, the heat flux Fh60 flows regularly from the heating source 51. So, the performance output becomes 0 (zero).

When the elastic member 16 is compressed or extended due to the strain occurred in the structure body 90, the heat flux Fh61 from the elastic member 16 transfers to two heat flux sensors 10, 60 together with the heat flux Fh60. A time difference between the voltage outputted from the heat flux sensor 10 and the voltage outputted from the heat flux sensor 60 is generated in accordance with a heat resistance of the heat flux sensor 10.

In detail, immediately after the time when the elastic member 16 is compressed or extended, the heat flux Fh61 does not reach the heat flux sensor 60 due to the heat resistance of the heat flux sensor 10. The heat flux sensor 10 outputs the voltage corresponding to the total of the heat flux Fh60 and the heat flux Fh61, and the heat flux sensor 60 outputs the voltage corresponding to the heat flux Fh60 such that the performance output becomes voltage corresponding to the heat flux Fh61. After the heat flux Fh61 flows in the heat flux sensor 60, the performance output becomes 0 (zero).

The strain detector 6 can detect a timing, at which the strain is generated.

The strain detector 6 in the sixth embodiment detects the timing of the generation of the strain by using the time difference due to the heat resistance of the heat flux Fh61 flowing in the elastic member 16 based on the generation of the strain, when the strain in the structure body 90 is generated. The performance output becomes larger as the heat generated in the elastic member 16 due to the strain becomes larger, and a heat generation rate becomes faster and the response with respect to the strain becomes quickly. Accordingly, the strain detector 6 in the sixth embodiment obtains the effects (a) to (d) in the first embodiment and a timing at which the strain is generated can be detected with high accuracy.

When the strain is repeatedly generated in the structure body 90, a friction heat between molecules inside of the elastic member 16 is accumulated in accordance with the deformation of the elastic member 16. The strain detector 6 in the sixth embodiment can cancel the accumulated friction heat in the same way as the heat flux 60 regularly flowing from the heating source 51 such that an instability of the output of the heat flux sensors 10, 60 can be prevented.

Seventh Embodiment

Figure 10:
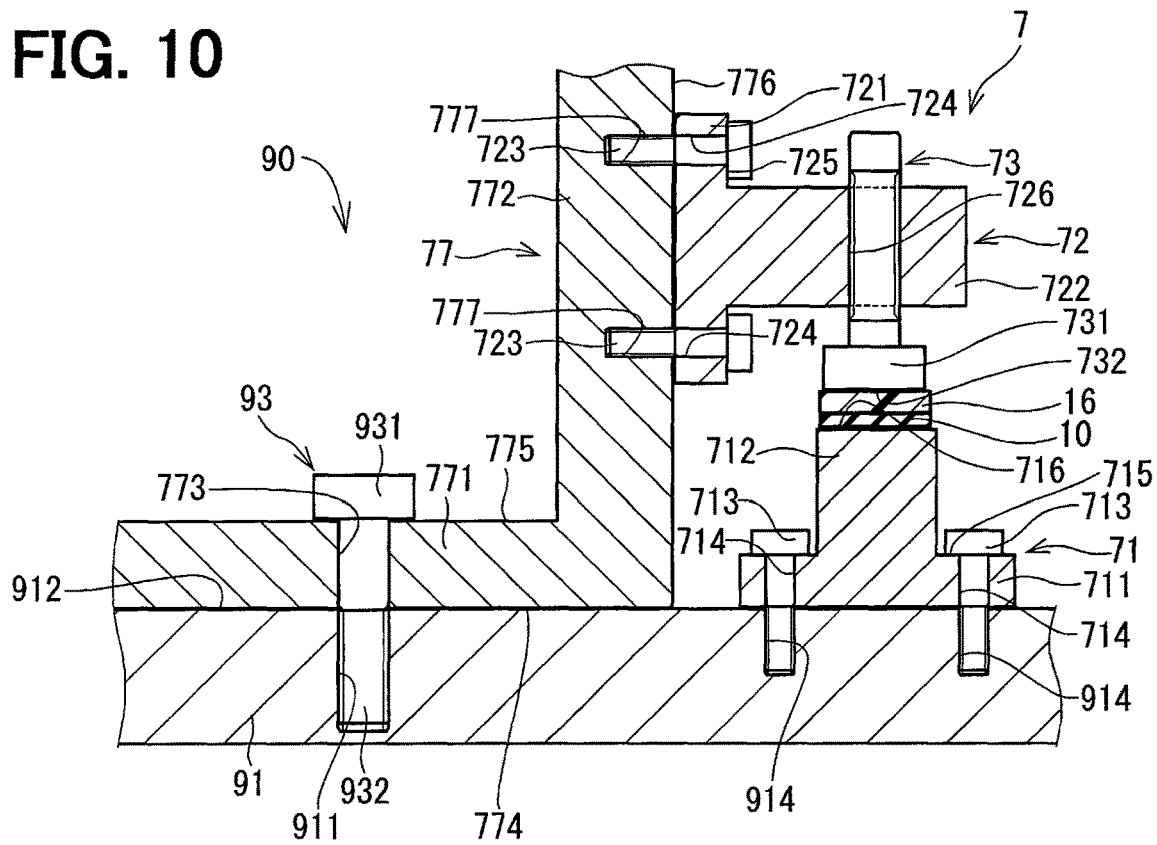
FIG. 10 is a diagram illustrating a schematic view of a strain detector in a seventh embodiment.

Next, a strain detector in a seventh embodiment is explained with reference to FIG. 10. In the seventh embodiment, an assemble member for assembling the elastic member and the structure member to the structure body is provided, and such configuration is different from the first embodiment. In the description which follows and in the drawings, identical or similar components bear the same reference numerals or characters in the first embodiment.

The strain detector 7 in the seventh embodiment has the elastic member 16, the heat flux sensors 10, and two assemble members 71, 72.

Firstly, the structure body 90 on which the strain detector 7 is provided, is explained. The structure body 90 has a base 91, an attachment member 77, and stainless bolts 93, 94.

The attachment member 77 has a contact portion 771, and a side wall portion 772.

The contact portion 771 contacts the contact surface 912 of the base 91. The contact portion 771 has a through hole 773 in which the stainless bolt 93 is inserted. The through hole 773 is formed from the contact surface 774 contacting the contact surface 912 of the base 91 to an opposite surface 775 with respect to the contact surface 774 such that the stainless bolt 93 is inserted into the through hole 773.

The side wall portion 772 is formed on the end surface 775 of the contact portion 771, and is extended in an opposite direction of the side wall portion 772 with respect to the base 91.

Two assemble members 71, 72 in the strain detector 7 connect the contact surface 912 of the base 91 to the side surface 776 of the side wall portion 772 through the elastic member 16 and the heat flux sensor 10. The assemble member 71 is referred to as "one assemble member" in the claim. The assemble member 72 is referred to as "another assemble member" in the claim.

The assemble member 71 is attached on the contact surface 912 of the base 91. The assemble member 71 has a base portion 711 and a first support portion 712.

The base portion 711 is formed as a planar part provided on the contact surface 912 of the base 91. The contact portion 711 has two through holes 714 in which the stainless bolts 713 are inserted for fixing the base portion 711 to the base 91. The bolts 713 inserted into the through holes 714 are inserted into tapped holes 914 opening in the contact surface 912 of the base 91 and are engaged with a threading formed inside of the tapped holes 914. Accordingly, the assemble member 71 is fixed to the base 91.

The first support portion 712 extends in a direction away from the base 91 on an opposite end surface 715 of the base portion 711 with respect to the base 91. The heat flux sensor 10 is attached on an end surface 716 on an opposite side with respect to the base portion 711 of the first support portion 712.

The assemble member 72 is attached on the side surface 776 of the side wall portion 772. The assemble member 72 has a base portion 721 and a second support portion 722.

The base portion 721 is formed as a planar part provided on the side surface 776 of the side wall portion 772. The base portion 721 has two through holes 724 in which the stainless bolts 723 are inserted for fixing the base portion 721 to the side wall portion 772. The bolts 723 inserted into the through holes 724 are inserted into tapped holes 777 opening in the side surface 776 of the side wall portion 772 and are engaged with a threading formed inside of the tapped holes 777. Accordingly, the assemble member 72 is fixed to the side wall portion 772.

The second support portion 722 extends in a direction away from the side wall portion 772 on an opposite end surface 725 of the base portion 721 with respect to the side wall portion 772. The second support portion 722 has a through hole 726, in which an adjusting screw 73 is inserted, on an end of the second support portion 722 on an opposite side with respect to the side wall portion 772.

The adjusting screw 73 is engaged with a threading formed inside of the through hole 726. The adjusting screw 73 can adjust a position of a head portion 731 of the adjusting screw 73 with respect to the second support portion 722. The adjusting screw 73 is attached in such a manner that the end surface 732 referred to as "a support surface" of the head portion 731 faces the end surface 716 of the first support portion 712. The elastic member 16 is attached on the end surface 732.

The elastic member 16, which is interposed between the heat flux sensor 10 and the end surface 732 on the end surface 716, is compressed at the compression deformation rate of substantially 30%, when no external force is applied to the structure body 90. The compression deformation rate of the elastic member 16 is adjustable by changing the position of the adjusting screw 73 with respect to the second support portion 722.

In the seventh embodiment, two assemble members 71, 72 are attached to the structure body 90 such that the elastic member 16 and the heat flux sensor 10 can be attached to the base 91 and the attachment member 77. The seventh embodiment obtains the effects (a) to (c) in the first embodiment and the amount of change of the strain energy in the structure body 90 can be detected by the elastic member 16 and the heat flux sensor 10, even if the structure body is operated.

Eighth Embodiment

A strain detector in an eighth embodiment is explained with reference to FIGS. 11 to 13. In the eighth embodiment, a determination unit for determining the deformation based on the detection result of the heat flux sensor is provided, and such unit is different from the first embodiment. In the description which follows and in the drawings, identical or similar components bear the same reference numerals or characters in the first embodiment.

Figure 11:
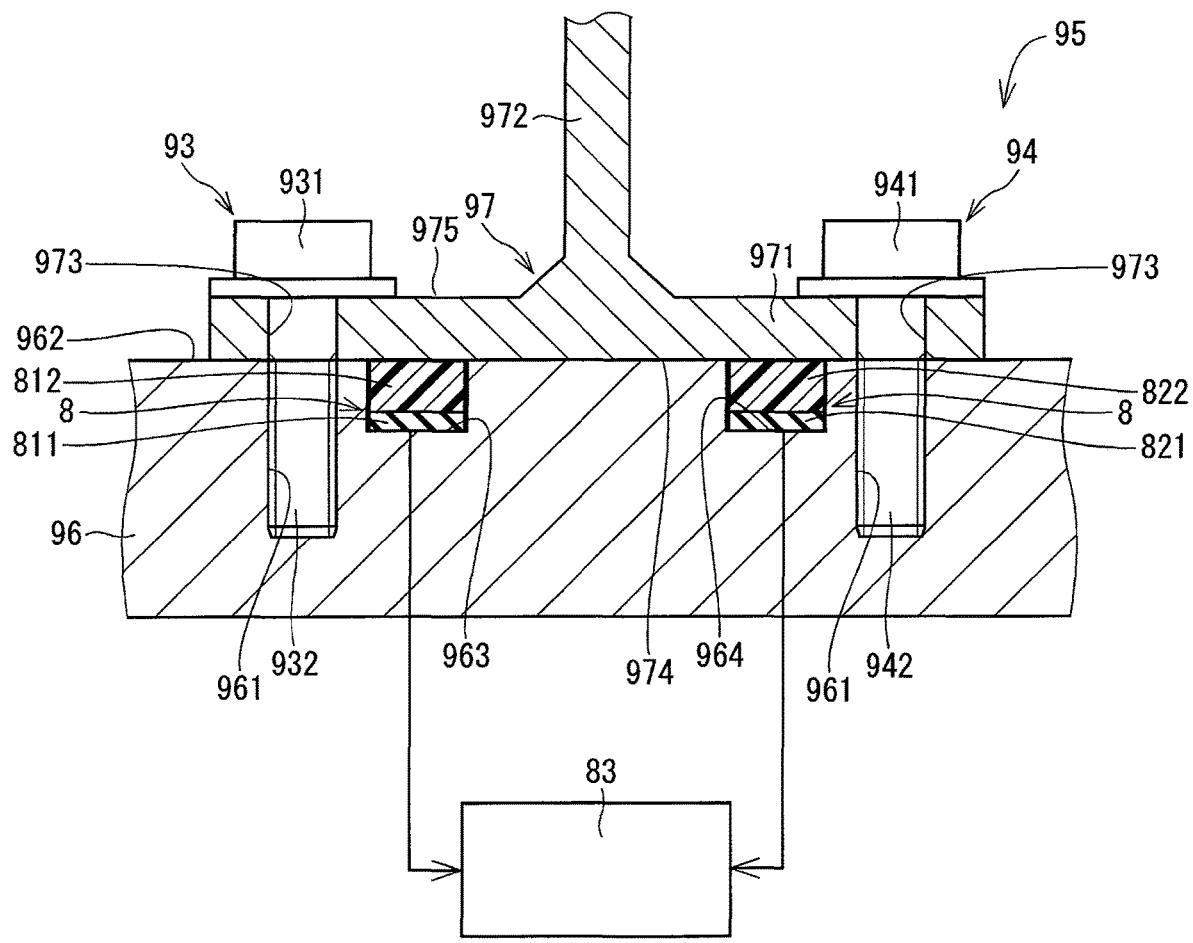
FIG. 11 is a diagram illustrating a schematic view of a strain detector in an eighth embodiment.

As shown in FIG. 11, the strain detector 8 in the eighth embodiment has the structure body 95 which includes a base 96 referred to as "a fastened member", an attachment member 97 referred to as "a fastened member", and stainless bolts 93, 94. In the structure body 95, the base 96 and the attachment member 97 are fixed by the stainless bolts 93, 94.

The strain detector 8 is interposed between the base 96 and the attachment member 97, and the strain detector 8 has two heat flux sensors 811, 821, the elastic members 812, 822, and the determination unit 83.

The base 96 is made of a metal, such as SUS 303. The base 96 is fixed to for example, a table or a floor surface (not shown). Bolt holes 961 in which the stainless bolts 93, 94 are inserted, are formed on the contact surface 962 of the base 96, on which the attachment member 97 is attached. A threading is formed on an inner wall of the bolt holes 961. The base 96 has a groove 963 in which the heat flux sensor 811 and the elastic member 812 are housed, and a groove 964 in which the heat flux sensor 821 and the elastic member 822 are housed.

The attachment member 97 is made of a metal, such as SUS 303. The attachment member 97 has a contact portion 971 and an extending portion 972.

The contact portion 971 contacts the contact surface 962 of the base 96. The contact portion 971 has through holes 973 in which the stainless bolts 93, 94 are inserted. The through hole 773 is formed from the contact surface 974 contacting the contact surface 962 of the base 96 to an opposite surface 975 with respect to the contact surface 974. The extending portion 972 is provided on an end surface 975 of the contact portion 971 in the substantially middle between two through holes 973. The extending portion 972 extends in an opposite direction with respect to the base 96 from the end surface 972.

The heat flux sensor 811 adheres to a bottom wall of the groove 963 by an adhesive material (not shown).

The elastic member 812 adheres to the contact portion 971 of the attachment member 97 on a side of the attachment member 97 of the heat flux sensor 811 by an adhesive material (not shown). The elastic member 812 is compressed at the compression deformation rate of substantially 30%, when no external force is applied to the structure body 95.

The heat flux sensor 821 adheres to a bottom wall of the groove 964 by an adhesive material (not shown).

The elastic member 822 adheres to the contact portion 971 of the attachment member 97 on a side of the attachment member 97 of the heat flux sensor 821 by an adhesive material (not shown). The elastic member 822 is compressed at the compression deformation rate of substantially 30%, when no external force is applied to the structure body 95.

The determination unit 83 is electrically connected to the heat flux sensors 811, 821. The determination unit 83 determines whether an external force applied to the extending portion 972 based on the detecting signal outputted from the heat flux sensors 811, 821 is within a predetermined range. A determination method in the determination unit 83 is explained later.

Figure 12:
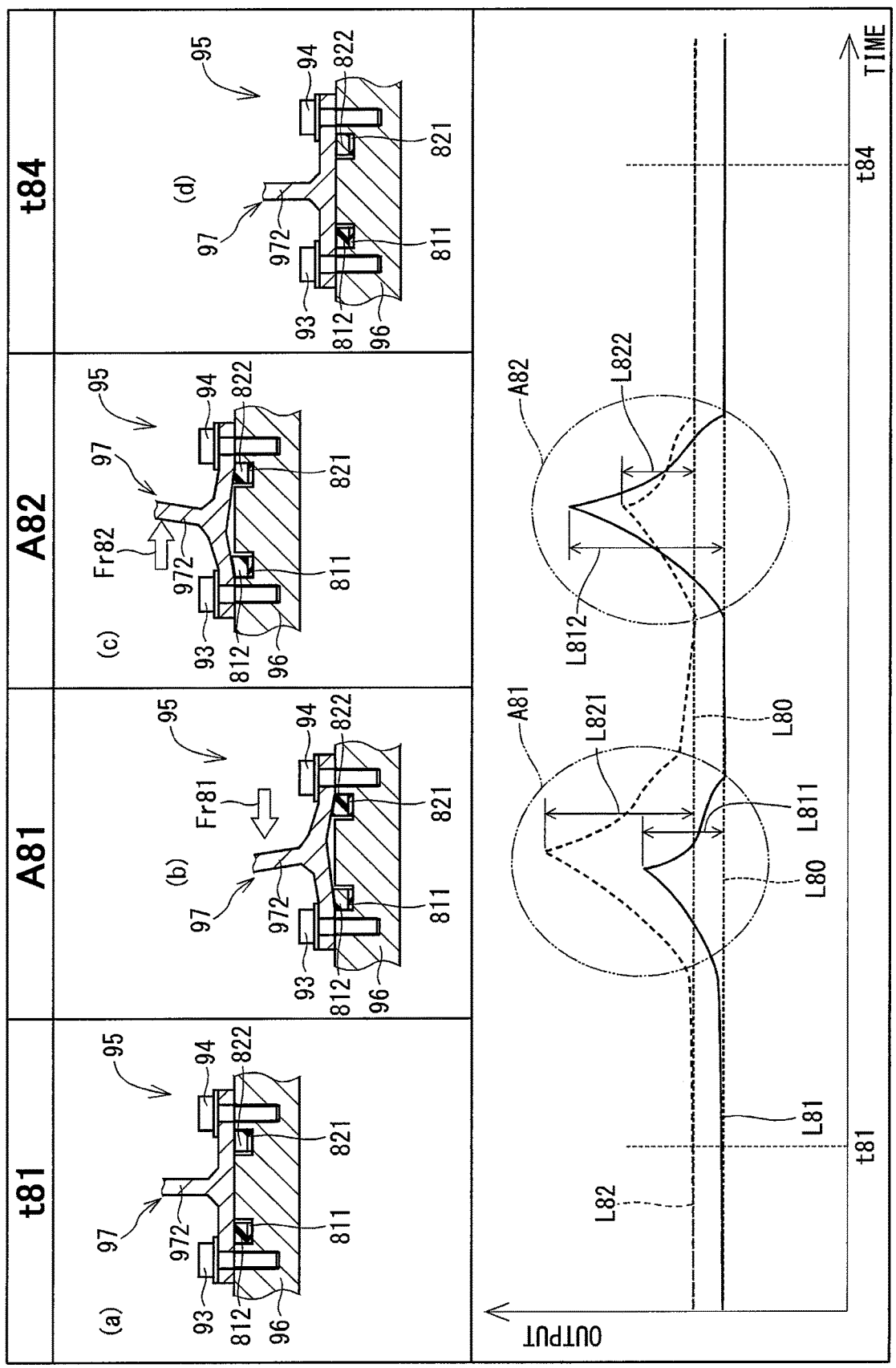
FIG. 12 is a characteristic diagram showing an output of two heat flux sensors based on time in the eighth embodiment.
Figure 13:
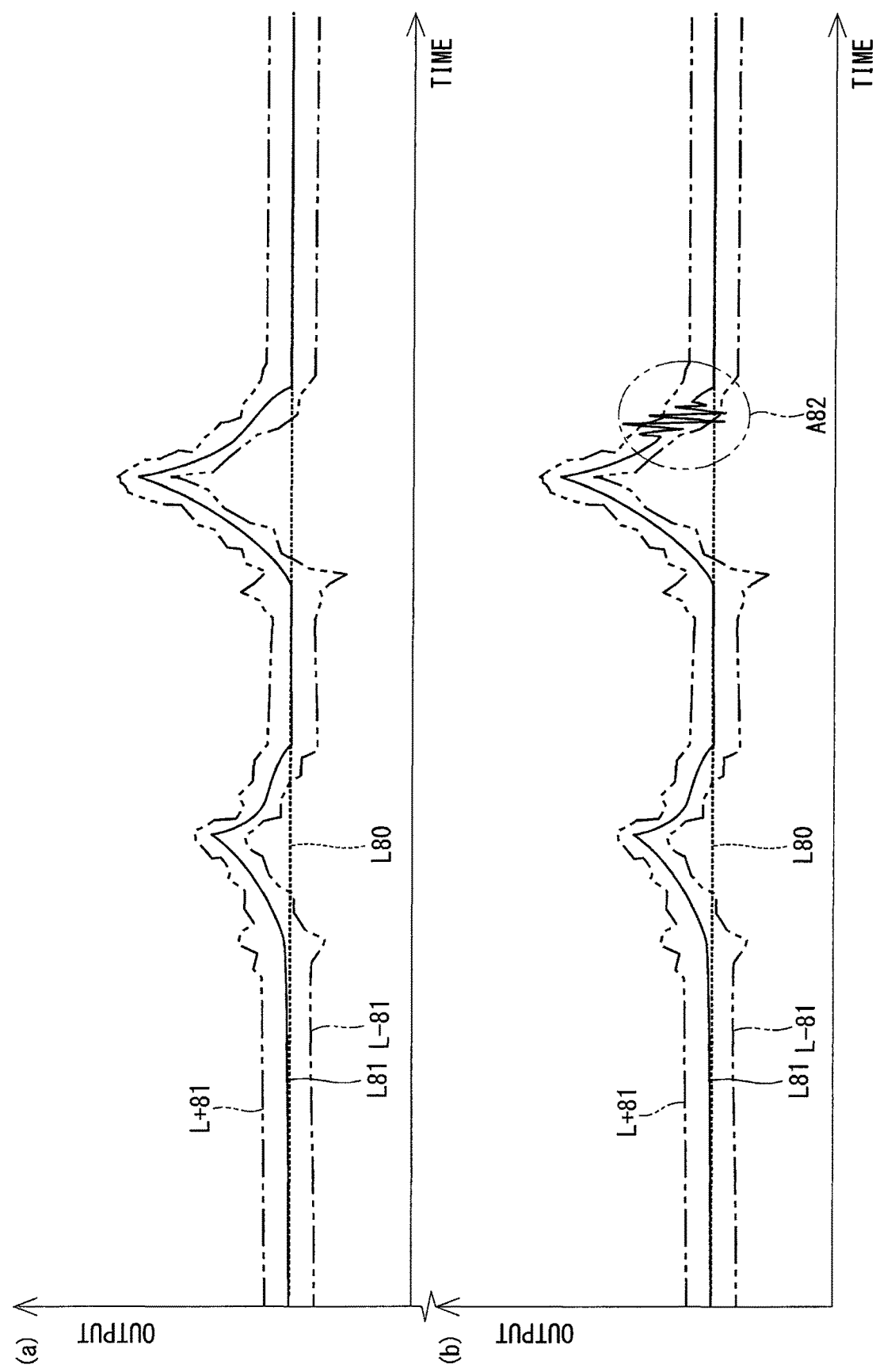
FIG. 13 is a diagram showing an output of the heat flux sensor based on time in the eighth embodiment.

The function of the strain detector 7 is explained in accordance with FIGS. 12 and 13.

FIG. 12 shows the detection signal per unit time outputted from the heat flux sensors 811, 821. FIG. 12 shows a time in a lateral direction, and a magnitude of the output of the detection signal in the heat flux sensors 811, 821 in a vertical direction. In FIG. 12, a solid line L81 shows the output of the detection signal in the heat flux sensor 811, and a dotted line L82 shows the output of the detection signal in the heat flux sensor 821. In FIG. 12, a reference line L80 which represents 0 (zero) in each output is staggered, because a difference between the outputs of the detection signals in the heat flux sensors 811, 821 is easily understood.

In FIG. 12, each of the detection signal outputted from the heat flux sensors 811, 821 is 0 (zero), when the external force is not applied to the structure body 95 (for example, the output of the detection signal at time t81).

The attachment member 97 inclines toward the stainless bolt 93, when the external force is applied to the extending portion 972 of the structure body 95. At this time, the stainless bolt 94 is extended in comparison with the stainless bolt 93 such that in the elastic members 812, 822 adhered to the attachment member 97, an extending length of the elastic member 822 provided near the stainless bolt 94 becomes longer than an extending length of the elastic member 812. Accordingly, as shown in a region A81 in the characteristic diagram of FIG. 12, the output L821 of the detection signal in the heat flux sensor 821 becomes larger than the output L811 of the detection signal in the heat flux sensor 811.

As shown in FIG. 12 (c), the attachment member 97 inclines toward the stainless bolt 94, when the external force Fr82 is applied to the extending portion 972 from a side of the stainless bolt 93. The extending length of the elastic member 812 is longer than the extending length of the elastic member 822. As shown in a region A82 in the characteristic diagram of FIG. 12, the output L812 of the detection signal in the heat flux sensor 812 becomes larger than the output L822 of the detection signal in the heat flux sensor 821.

Later, the structure body 95 returns to an original state as shown in FIG. 12 (d), when the external force applied to the extending portion becomes 0 (zero). The detection signal outputted from the heat flux sensors 811, 812 becomes 0 (zero) (for example, the output of the detection signal at time t84).

FIG. 13 shows the detection signal per unit time outputted from the heat flux sensors 811. FIG. 13 (a) shows the detection signal per unit time outputted from the heat flux sensors 811, when the device including the structure body 95 is normally operated. FIG. 13 (b) shows the detection signal per unit time outputted from the heat flux sensors 811, when the device including the structure body 95 is not normally operated. FIG. 13 shows a time in a lateral direction, and shows a magnitude of the output of the detection signal in the heat flux sensors 811 in a vertical direction.

The meaning of "normally operated" is that the deformation of the structure body 95 is within a predetermined permissible range which is previously set, when the device including the structure body 95 is operated. Namely, the meaning of "not normally operated" is that the deformation of the structure body 95 is beyond the predetermined permissible range, when the device including the structure body 95 is operated. At this time, the heat flux sensor 811 is explained, and the heat flux sensor 821 is same like the heat flux sensor 811.

In the determination unit 83, to which the detection signal of the heat flux sensor 811 is inputted, an upper output L+81 and a lower output L−81 are set, as shown in FIG. 13. The upper output L+81 and the lower output L−81 are referred to as a threshold for determining whether the deformation of the attachment member 92 is within the permissible range or not. The upper output L+81 and the lower output L−81 are calculated from a standard deviation based on the output results which are achieved, after a plurality of the normal operations are repeatedly done. For example, in FIG. 13, a value corresponding to three times of the standard deviation at each time which is obtained based on 30 (thirty) times of samplings, is referred to as the upper output L+81 and as the lower output L−81.

In FIG. 13 (a), a time variation of the detection signal outputted from the heat flux sensor 811 is positioned between the upper output L+81 and the lower output L−81 in a whole area of the time. So, the determination unit 83 determines that the device including the structure body 95 is normally operated.

On the other hand, in the time variation of the detection signal outputted from the heat flux sensor 811 as shown in FIG. 13 (b), the output is over the upper output L+81 and is below the lower output L−81 in the region A82 in FIG. 13 (b). So, the determination unit 83 determines that the device including the structure body 95 is not normally operated. This result means that for example the device including the structure body 95 is collided by an unintended object in an operation state, and that an external force, which is above the external force applied to the device in a normal operation state, is applied to the structure body 95.

In the strain detector 8 in the eighth embodiment, the upper output and the lower output with respect to the detection signals of the heat flux sensors 811, 812 are set in the determination unit 83. When the device including the structure body 95 is operated, the structure body 95 is deformed by the external force applied to the attachment member 97. The heat flux sensors 811, 812 detect the magnitude of the heat flux flowing between the inside of the elastic members 811 and the outside, 812 based on the deformation of the structure body 95. When the output of the detection signals of the heat flux sensors 811, 812 is between the upper output and the lower output, the external force applied to the structure member 95 is within the predetermined range. On the other hand, when the output of the detection signals of the heat flux sensors 811, 812 is above the upper output or below the lower output, the external force applied to the structure member 95 is beyond the predetermined range.

Since the strain detector 8 in the eighth embodiment can detect the external variation applied to the structure member 95 based on the magnitude of the detection signals from the heat flux sensors 811, 812, it is possible to detect whether the deformation of the structure body 95 is within the predetermined range. The eighth embodiment achieves the effects (a) to (d) in the first embodiment, and detects the operation state for the device including the structure body 95.

Another Embodiment

In the above mentioned embodiments, the structure body has the base and the attachment member referred to as a fastened member, and the stainless bolts referred to as a fastening member. The configuration of the structure body is not limited to the above embodiments. Three or more fastened members may be fixed by one fastening member.

Furthermore, three or more fastened members may be fixed by two or more fastening members.

In the first embodiment, the elastic member is compressed or extended in accordance with the change of the gap between the base and the attachment member in the groove due to the external force applied to the structure body. However, the compression or the extension of the elastic member is not limited in the above embodiment. The elastic member may be compressed or extended in accordance with a deformation of at least one of the members configuring the structure body.

In the above mentioned embodiments, the base and the attachment member are made of metal. The material of the base and the attachment member is not limited to metal. The resin may be used as the material of the base and the attachment member.

In the above mentioned embodiments, the fastening member fastening two fastened members is the stainless bolt. However, the fastening member is not limited to the stainless bolt. A fastening may be done by a welding or an adhesive. In this instance, the fastening member is a welding bead or an adhesive.

In the above mentioned embodiments, the heat flux sensor is formed as a film from a thermoplastic resin. However, the configuration of the sensor is not limited to the film. The heat flux sensor may be configured to detect the heat flux flowing between the inside of the elastic member and the outside every unit time.

In the above mentioned embodiments, the elastic member referred to as an deformable member is made of viton rubber. The material used for the deformable member is not limited to viton. A member is made of some material in such a manner that the member generates heat, or absorbs heat in accordance with the compression or extension of the member and the member may be made of other kinds of rubber, resin, or metal.

The strain detector in the fifth embodiment shows one elastic member interposed between two heat flux sensors. Such configuration may be applied to the second, the third, the fourth, the seventh, and the eighth embodiments.

The strain detector in the sixth embodiment shows that two heat flux sensors positioned in one side of one elastic member. Such configuration may be applied to the second, the third, the fourth, the seventh, and the eighth embodiments.

The spacer in the second embodiment may be applied to the strain detector having the attachment member in the seventh embodiment.

The eighth embodiment detects the direction of the external force applied to the attachment member, and detects whether the external force is within the predetermined range by using a pair of the combinations of the heat flux sensor and the elastic member. By using one combination of the heat flux sensor and the elastic member, whether the external force is within the predetermined range may be determined.

In the eighth embodiment, a value corresponding to three times of the standard deviation at each time which is obtained based on 30 (thirty) times of samplings, is referred to as the upper output and as the lower output. The setting condition regarding the upper output and the lower output is not limited to the above calculation.

The present disclosure is not limited to the above mentioned embodiments. A variety of forms may be implemented within a reasonable scope.

What is claimed is:

1. A strain detector for detecting a strain energy of a structure body having first and second fastened members fastened by a fastening member, comprising:
   a deformable member interposed between the first and second fastened members and configured to be compressed or extended in accordance with a deformation of the fastening member or at least one of the first and second fastened members in such a manner that the deformable member generates heat when compressed and absorbs heat when extended; and
   a heat flux detecting member interposed between the deformable member and one of the first and second fastened members and configured to be deformable based on the compression or the extension of the deformable member, the heat flux detecting member being in thermal communication with the deformable member such that the heat flux detecting member detects heat flux flowing between an inside of the deformable member and an outside of the deformable member;
   wherein movement of the heat flux detecting member in a direction in which the deformable member is compressed or extended is restricted by the first and second fastened members fastened by the fastening member.

2. The strain detector according to claim 1, wherein the heat flux detecting member comprises
   an insulation substrate formed of a thermoplastic resin and having plural via holes penetrating in a thickness direction of the insulation substrate;
   a first conductive pattern provided on one surface of the insulation substrate;
   a second conductive pattern provided on another surface of the insulation substrate;
   a plurality of first interlayer connecting members made of a metal and provided in part of the via holes; and
   a plurality of second interlayer connecting members made of a metal different from the metal of the first interlayer connecting members, and provided in the via holes next to the via holes in which the first interlayer connecting member is provided; wherein
   the first interlayer connecting members and the second interlayer connecting members are alternately connected in series by means of the first conductive pattern and the second conductive pattern.

3. The strain detector according to claim 1, wherein the deformable member and the heat flux detecting member are provided in a groove formed on at least one of the first and second fastened members.

4. The strain detector according to claim 1, further comprising:
   a spacer interposed between the first and second fastened members and having a housing space in which the deformable member and the heat flux detecting member are housed.

5. The strain detector according to claim 1, further comprising:
   a washer interposed between of the first and second fastened members and having a housing space in which the deformable member and the heat flux detecting member are housed; wherein
   the fastening member is a bolt.

6. The strain detector according to claim 5, wherein
   the washer has a main portion interposed between the first fastened member and the bolt and contacting a bolt head of the bolt, and an extension portion interposed between the main portion and the second fastened member;
   the deformable member and the heat flux detecting member are interposed between an extension portion end surface of the extension portion facing the first fastened member and a member end surface of the second fastened member facing the extension portion end surface;
   the deformable member is configured to adhere to one of the extension portion end surface and the member end surface; and
   the heat flux detecting member is configured to adhere to another of the extension portion end surface and the member end surface.

7. The strain detector according to claim 1, wherein the deformable member is interposed between two heat flux detecting members.

8. The strain detector according to claim 1, wherein two of heat flux detecting members are provided side by side on one side of the deformable member.

9. The strain detector according to claim 1, further comprising:
   one attachment member fixed to the first fastened member and is configured to support the heat flux detecting member; and
   another attachment member fixed to the second fastened member and configured to support the deformable member.

10. The strain detector according to claim 9, further comprising:
    a supporting surface provided on the one attachment member or the other attachment member configured to support the heat flux detecting member or the deformable member; and
    an adjusting screw configured to adjust a position of the supporting surface with respect to the one attachment member or the other attachment member.

11. The strain detector according to claim 1, further comprising:
    a determination unit that determines whether an external force applied to the structure body based on a detection result of the heat flux detecting member is within a predetermined range.

12. The strain detector according to claim 1, wherein
    the heat flux detecting member outputs a voltage corresponding to the heat flux every unit time; and
    an amount of charge of the strain energy in the structure body is detected based on a time variation of the voltage outputted from the heat flux detecting member.

13. The strain detector according to claim 1, wherein
    the deformable member is an elastic member; and
    the elastic member is compressed at a compression deformation rate of a predetermined value, when no external force is applied to the structure body.

* * * * *